(12) United States Patent
Chiang et al.

(10) Patent No.: US 9,406,860 B2
(45) Date of Patent: Aug. 2, 2016

(54) WAFER LEVEL PACKAGE STRUCTURE FOR TEMPERATURE SENSING ELEMENTS

(71) Applicant: Challentech International Corporation, Zhubei (TW)

(72) Inventors: Chung-I Chiang, Taoyuan (TW); Yun-Kuei Chiu, New Taipei (TW)

(73) Assignee: Chung-I Chiang, Zhongli (TW)

( * ) Notice: Subject to any disclaimer, the term of this patent is extended or adjusted under 35 U.S.C. 154(b) by 0 days.

(21) Appl. No.: 14/800,422

(22) Filed: Jul. 15, 2015

(65) Prior Publication Data
US 2016/0020377 A1    Jan. 21, 2016

(30) Foreign Application Priority Data
Jul. 16, 2014    (CN) .......................... 2014 2 0391490

(51) Int. Cl.
| | | |
|---|---|---|
| H01L 31/058 | (2006.01) | |
| H01L 35/32 | (2006.01) | |
| H01L 35/08 | (2006.01) | |
| H01L 35/14 | (2006.01) | |
| H01L 35/16 | (2006.01) | |
| H01L 35/10 | (2006.01) | |
| H01L 27/16 | (2006.01) | |

(52) U.S. Cl.
CPC .............. *H01L 35/325* (2013.01); *H01L 27/16* (2013.01); *H01L 35/08* (2013.01); *H01L 35/10* (2013.01); *H01L 35/14* (2013.01); *H01L 35/16* (2013.01)

(58) Field of Classification Search
CPC ....................................................... H01L 35/325
USPC ........................................................... 257/467
See application file for complete search history.

(56) References Cited

U.S. PATENT DOCUMENTS

2011/0162979 A1*    7/2011    Shachar ............. G01N 33/5438
                                                            205/777.5

* cited by examiner

*Primary Examiner* — Anthony Ho
(74) *Attorney, Agent, or Firm* — Wang Law Firm, Inc.

(57) ABSTRACT

A wafer level package structure for temperature sensing elements, which includes a wafer cover and a substrate. The wafer cover is formed of infrared penetrable material. The wafer cover has a plurality of package walls, and the plurality of package walls form a plurality of first grooves and a plurality of second grooves in the wafer cover. The substrate includes a plurality of chip areas, a plurality of soldering areas, and a plurality of pin areas. The plurality of chip areas are disposed a temperature sensing chip respectively and correspond to the plurality of first grooves respectively and the plurality of soldering areas solder with respect to the plurality of package walls, such that the plurality of chip areas and the plurality of first grooves form a plurality of vacuum sealed spaces respectively.

10 Claims, 9 Drawing Sheets

WAFER LEVEL PACKAGE STRUCTURE FOR TEMPERATURE SENSING ELEMENTS

CROSS-REFERENCE TO RELATED APPLICATION

This application claims priority from Chinese Patent Application No. 201420391490.8, filed on Jul. 16, 2014, in the State Intellectual Property Office of China, the content of which are hereby incorporated by reference in their entirety for all purposes.

BACKGROUND OF THE INVENTION

1. Field of the Invention

The disclosure relates to a package structure, and more particularly to a wafer level package structure for temperature sensing elements.

2. Description of the Related Art

Presently, infrared (IR) video camera has been applied to record and store successive thermal images. The infrared (IR) video camera includes a temperature sensing chip, which includes an array of temperature sensing elements. Each temperature sensing element may change its resistance value correspondingly according to the energy of the received infrared radiation thereof. Thus, the resistance value change of each temperature sensing element may correspond to the strength of the thermal energy, and each array of temperature sensing elements array may then produce a thermal image.

The temperature sensing chip is disposed on a base, and the base is packaged with a cover. The package space is maintained in a vacuum state in order to prevent thermal convection produced in the package space from affecting the thermal energy which is detected by the array of temperature sensing elements. Also, the sensitivity of the array of temperature sensing elements is related to the vacuum level of the package space.

Since mobile phones are generally disposed with a camera, how to increase the application of this camera is the scope in which many manufacturers may concern. If the application of thermal sensing technology can be increased for the camera of the mobile phone, i.e. the camera of the mobile phone can also detect temperature and produce a thermal image, it would be good news to the consumers. However, the current prices of temperature sensing cameras are still so high that it is not favorable to be popularized. At the same time, the volume of the traditional temperature sensing camera is also too large and is not suitable to be installed on the mobile phone. Thus, if the manufacturing cost of temperature sensing camera can be reduced and the volume of temperature sensing camera can be decreased, it will facilitate its application on the mobile phone.

SUMMARY OF THE INVENTION

In view of the above problems, the purpose of the present invention is to provide a wafer level package structure for temperature sensing elements to enhance the package efficiency of the temperature sensing elements.

In view of the above problems, the another purpose of the present invention is to provide a wafer level package structure for temperature sensing elements to enhance the package strength of the temperature sensing elements.

In view of the above problems, the one more purpose of the present invention is to provide a wafer level package structure for temperature sensing elements which is possible to conduct a test after package and before cutting in order to reduce the manufacturing time course of packaging devices of the temperature sensing elements and also decrease the volumes of the packaging devices.

According to the aforementioned purposes, in an embodiment, the present invention provides a wafer level package structure for temperature sensing elements, which includes a wafer cover and a substrate. The wafer cover is formed of an infrared penetrable material The wafer cover has a plurality of package walls, and the plurality of package walls form a plurality of first grooves and a plurality of second grooves in the wafer cover. The substrate includes a plurality of chip areas, a plurality of soldering areas, and a plurality of pin areas. The plurality of chip areas is disposed with a temperature sensing chip respectively and corresponds to the plurality of first grooves respectively. The plurality of soldering areas solder with respect to the plurality of package walls, such that the plurality of chip areas and the plurality of first grooves form a plurality of vacuum sealed spaces respectively, and the plurality of pin areas are cut to form a plurality of packaging devices of temperature sensing elements and corresponding to the plurality of second grooves.

Preferably, the infrared penetrable material may include germanium, silicon, chalcogenide or sulfide.

Preferably, the plurality of package walls may include a plurality of package rings. An area enclosed by each package ring corresponds to a chip area, and a ring wall of each package ring corresponds to a soldering area.

Preferably, each of the plurality of soldering areas may include a testing circuit.

Preferably, each of the plurality of soldering areas may include a concave structure. The shape of the concave structure corresponds to the shape of each of the plurality of package walls.

Preferably, each of the plurality of pin areas may electrically connect to the temperature sensing chip respectively through a metal layer with isolation film structure at the lower side of the soldering area.

Preferably, each of the plurality of package walls may be a multi-layer wall structure.

Preferably, each of the plurality of soldering areas may include a concave structure. The shape of the concave structure corresponds to the shape of the multi-layer wall structure of each of the plurality of package walls.

BRIEF DESCRIPTION OF THE DRAWINGS

The foregoing and other features and advantages of the present invention will become more apparent by illustrating the exemplary embodiments thereof in detail with reference to the accompanying drawings, wherein.

DETAILED DESCRIPTION OF THE PREFERRED EMBODIMENTS

As used herein, the term "and/or" includes any or all combinations of one or more of the associated listed items. When expressions "at least one of" precedes a list of elements, it modifies the entire list of elements but does not modify the individual elements of the list.

Figure 1:
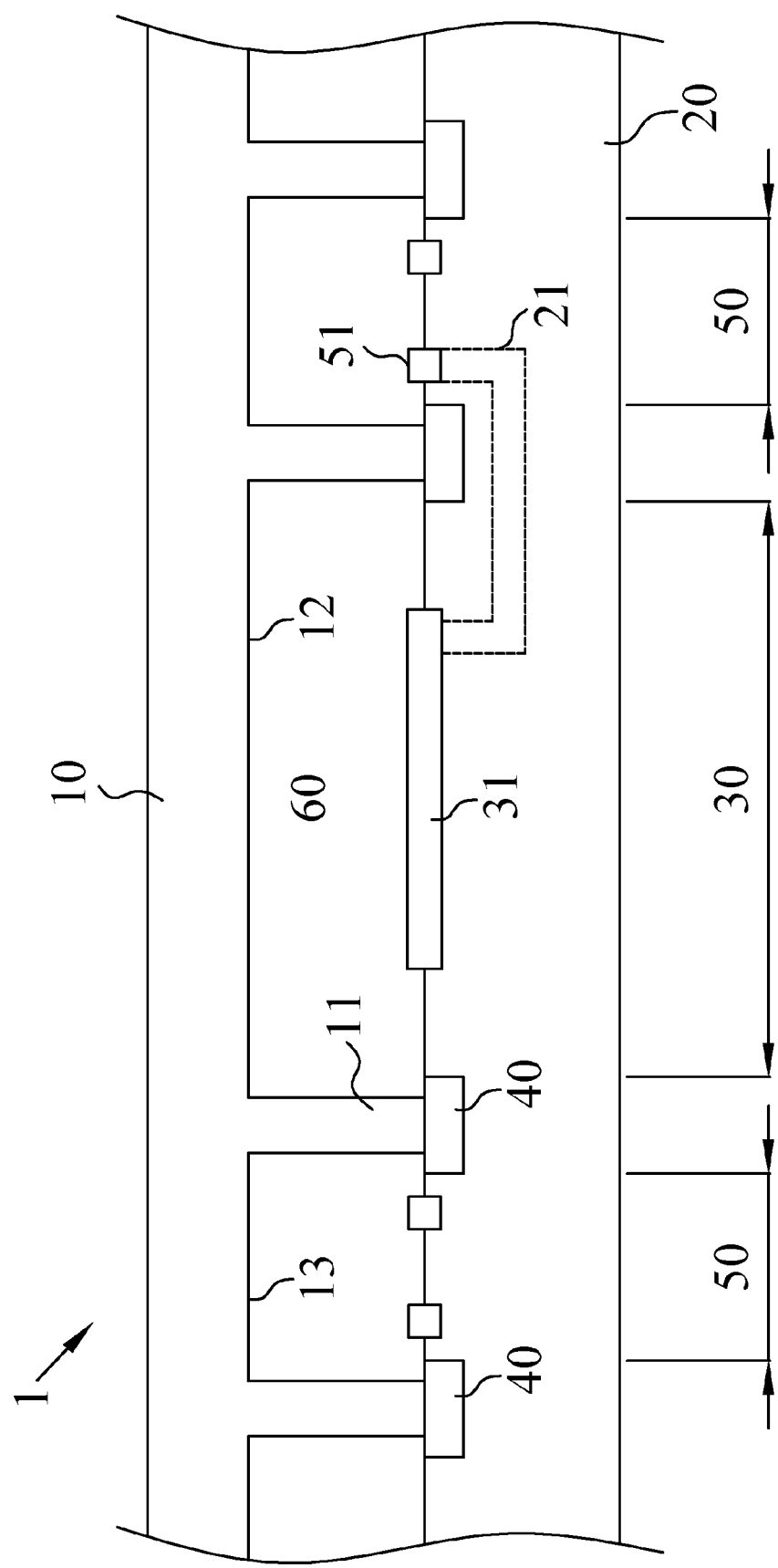
FIG. 1 is a cross-sectional view of a first embodiment of a wafer level package structure for temperature sensing elements according to the present invention.
Figure 2:
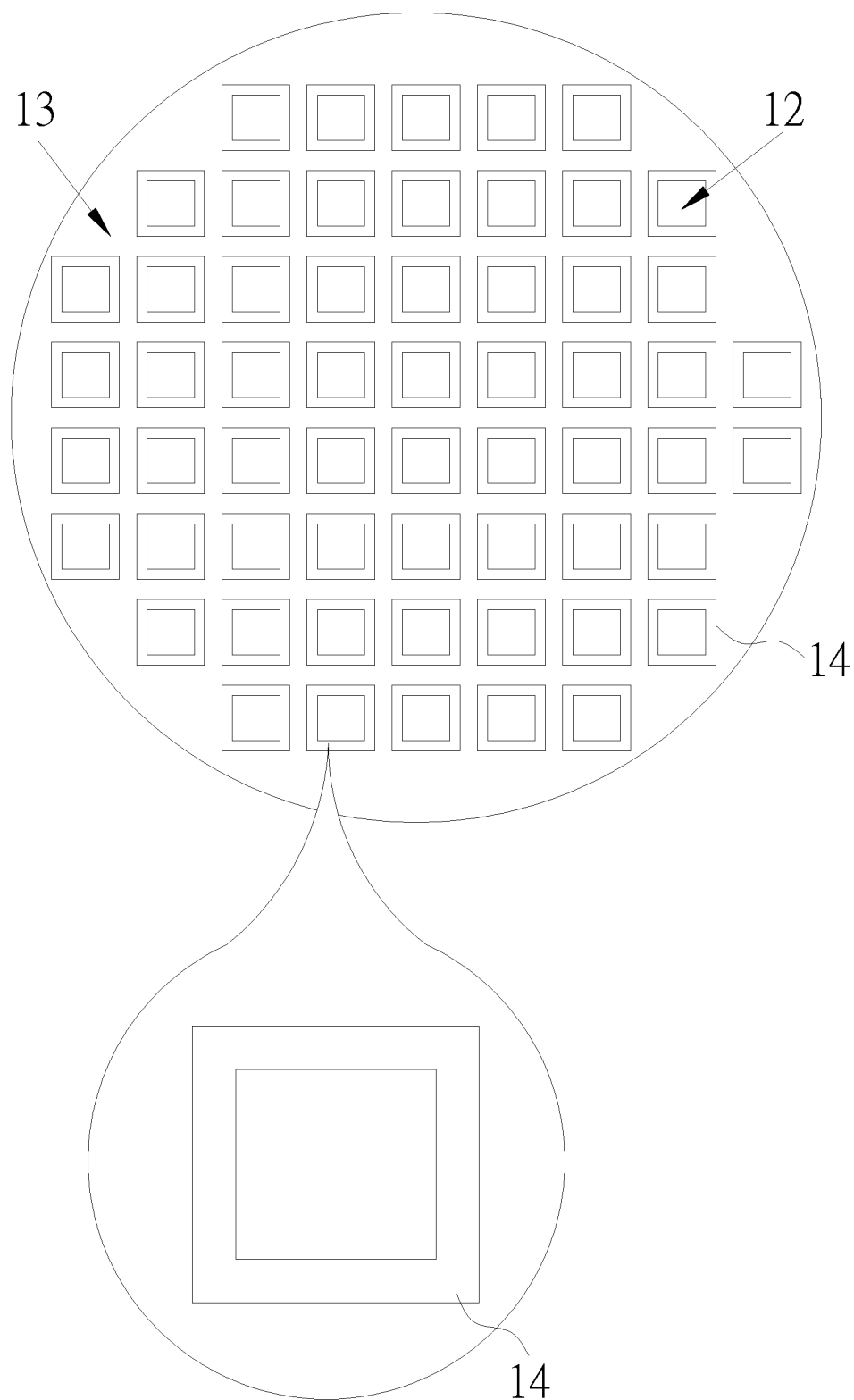
FIG. 2 is a schematic view of the wafer cover of the first embodiment of the wafer level package structure for temperature sensing elements according to the present invention.

Please refer to FIG. 1 and FIG. 2, FIG. 1 is a cross-sectional view of the first embodiment of the wafer level package structure for temperature sensing elements according to the present invention, and FIG. 2 is a schematic view of the wafer cover of the first embodiment of the wafer level package structure for temperature sensing elements according to the present invention. In the figures, the wafer level package structure 1 includes a wafer cover 10 and a substrate 20.

The wafer cover 10 is formed of an infrared penetrable material. The wafer cover 10 has a plurality of package walls 11 and the plurality of package walls 11 form a plurality of first grooves 12 and a plurality of second grooves 13 in the wafer cover 10. For implementation, the infrared penetrable material may include germanium (Ge), silicon (Si) chalcogenide, or sulfide.

The substrate 20 includes a plurality of chip areas 30, a plurality of soldering areas 40, and a plurality of pin areas 50. Each chip area 30 corresponds to a first groove 12 for disposing at least one temperature sensing chip 31 or other circuit elements. Each pin area 50 corresponds to a second groove 13.

The soldering area 40 may be formed of aluminium or with some other soldering metals in order to solder accordingly with the corresponding package walls 11, and the soldering packaging process is conducted in a vacuum chamber, such that the chip area 30 and the first groove 12 form a plurality of vacuum sealed spaces 60. The vacuum level thereof influences the sensitivity of the temperature sensing chip 31.

Each pin area 50 is disposed with a plurality of conductive pads 51, which are electrically connected to the temperature sensing chips 31 and other electrical circuits respectively through a metal layer with isolation film structure 21 at the lower side of the soldering area 40.

Please refer to FIG. 2, wherein the plurality of first grooves 12 are formed by a plurality of package rings 14. An area enclosed by each package ring 14 corresponds to the chip area 30. A ring wall of each package ring 14 corresponds to the soldering area 40. Areas outside the plurality of package rings 14 are all of the pin areas 50 which are used to dispose the conductive pads 51 or test circuits.

Figure 3:
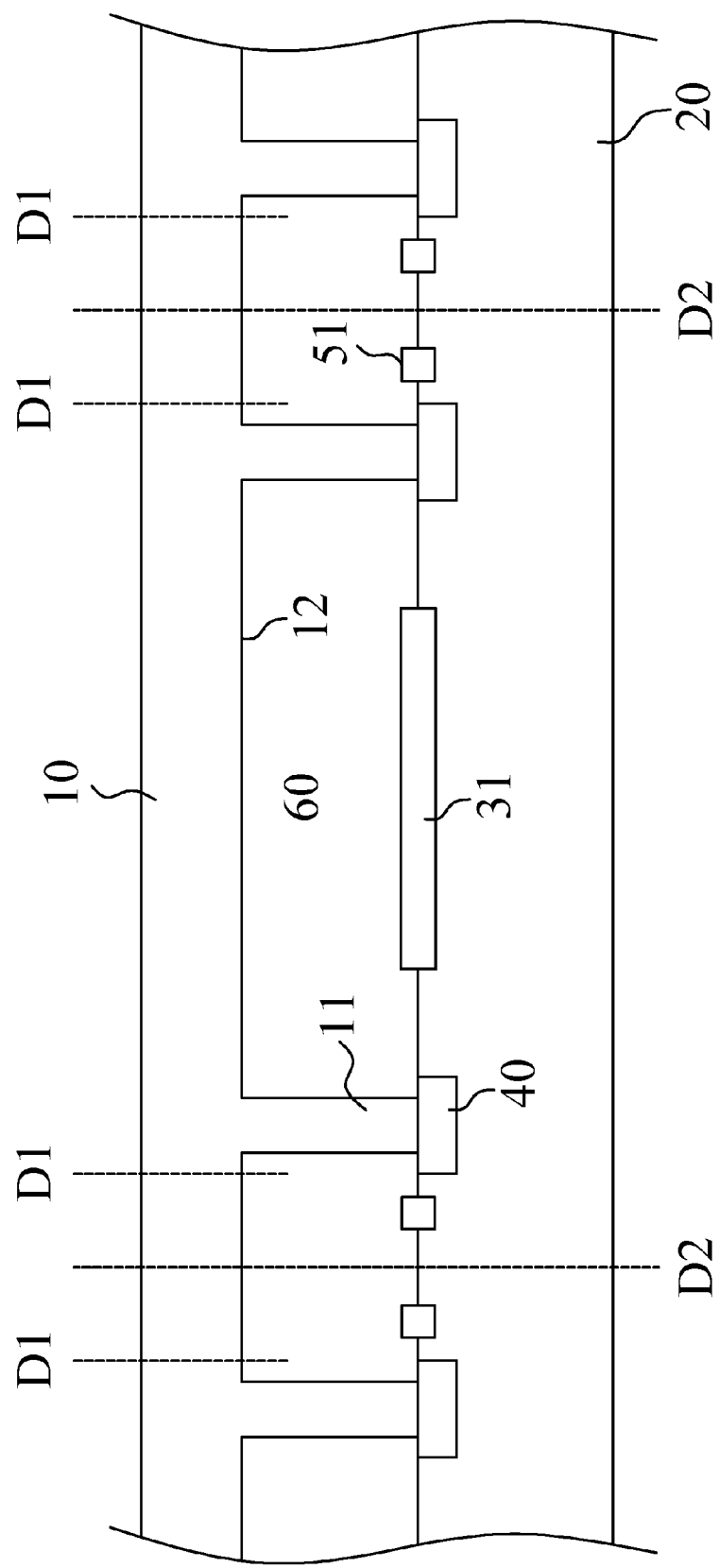
FIG. 3 is a schematic view of being cut into packaging devices of the temperature sensing elements of the first embodiment of the wafer level package structure for temperature sensing elements according to the present invention.

Please then refer to FIG. 3, it depicts a schematic view of being cut into packaging devices of the temperature sensing elements of the first embodiment of the wafer level package structure of the present invention. After soldering the wafer cover 10 with the substrate 20 and the packaging is completed, the portion corresponding to pin area 50 in the wafer cover 10 may be cut along the cutting lines D1 to expose the conductive pads 51. Thus, the probe of the testing equipment may contact the conductive pads 51 to input or receive testing signals to test and sort the temperature sensing chips 31 after packaging and whether the functions of the other electrical circuits are normal or not, whether being damaged or not during the packaging process.

After the test is completed, the pin area 50 is cut along the cutting line D2 to form a plurality of packaging devices of temperature sensing elements. And the exposed conductive pads 51 become the outward pin electrodes of the packaging devices of these temperature sensing elements.

Further, in addition to the conductive pads 51, based on the requirements, each pin area 50 may include a testing circuit to assist the test of the temperature sensing chips 31.

Figure 4:
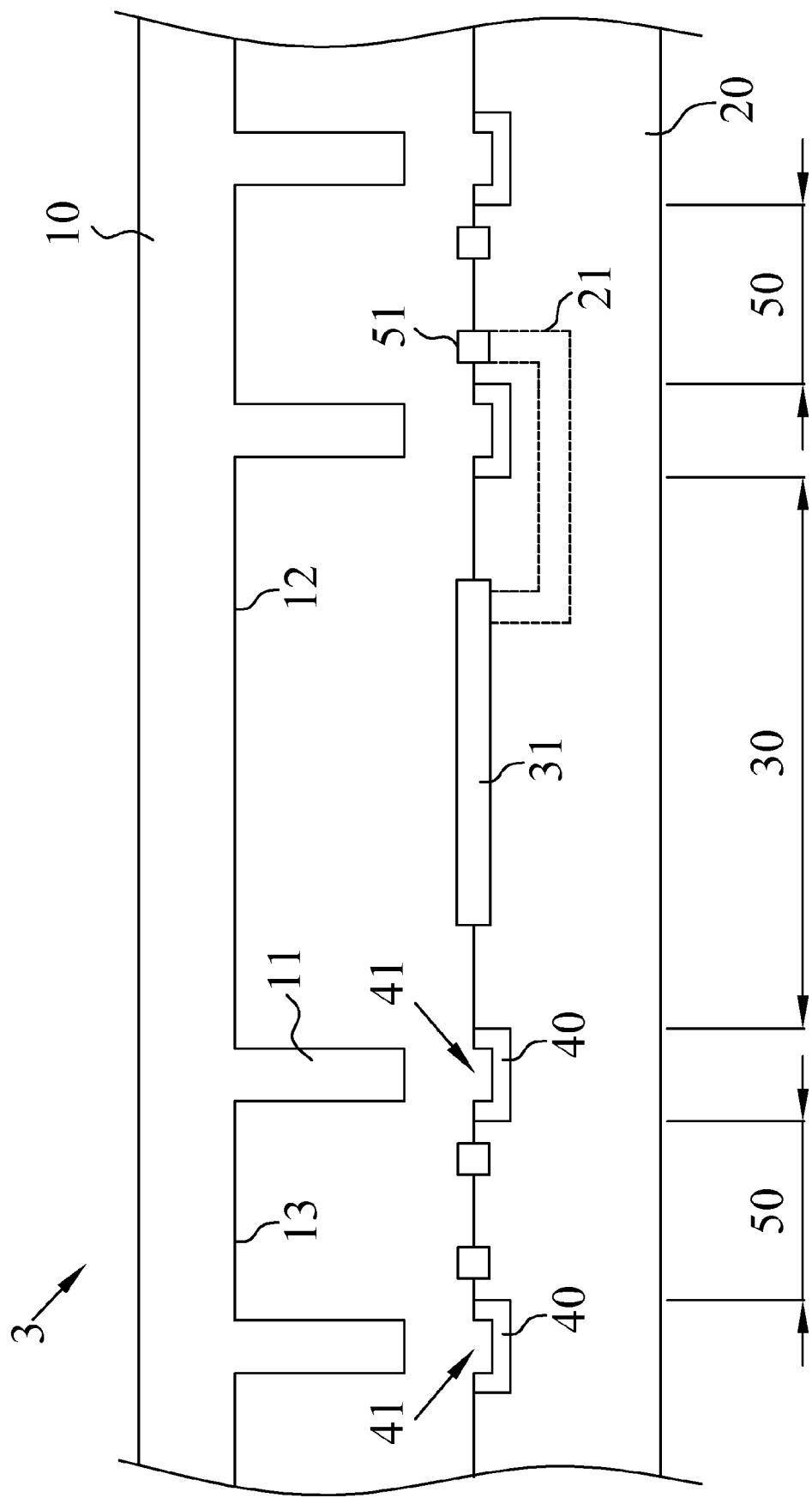
FIG. 4 is a cross-sectional view of a second embodiment of a wafer level package structure for temperature sensing elements according to the present invention.

Please refer to FIG. 4, which is a cross-sectional view of the second embodiment of the wafer level package structure for temperature sensing elements according to the present invention. The wafer level package structure 3 of the second embodiment is similar to that of the first embodiment, but the difference between the second embodiment and the first embodiment is that: each soldering area 40 may include a concave structure 41, and the shape of the concave structure 41 corresponds to the shape of each package wall 11. Thus, when the soldering is being conducted, there will be much more contact areas between the package wall 11 and the concave structure 41, which can enhance the strength of soldering, in order to facilitate the vacuum level in the vacuum sealed space 60 being able to maintain longer time after the package is completed. In addition, when the wafer cover 10 covers the substrate 20, the package wall 11 is easy to be embedded in the concave structure 41 and to be located, the presence of the concave structure 41 also facilitates the self-alignment between the wafer cover 10 and the substrate 20.

The concave structure 41 of each soldering area 40 is also applicable to the second embodiment, but it will not be discussed herein.

Figure 5:
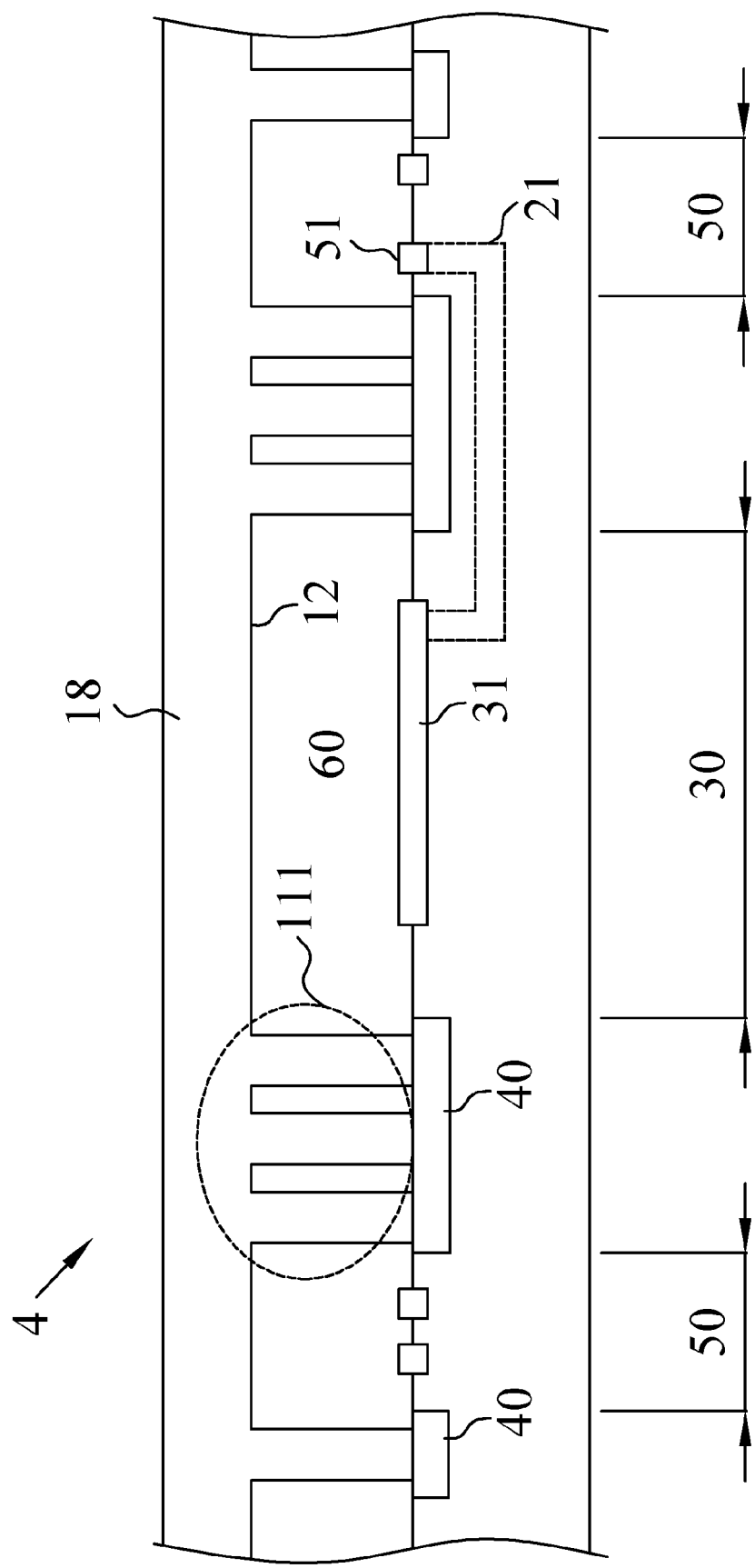
FIG. 5 is a cross-sectional view of a third embodiment of a wafer level package structure for temperature sensing elements according to the present invention.

Please refer to FIG. 5, which is a cross-sectional view of the third embodiment of the wafer level package structure for temperature sensing elements according to the present invention. In the figure, the wafer level package structure 4 of the third embodiment is similar to that of the first embodiment, but the difference between the third embodiment and the first embodiment is that: the package wall 11 is a multilayer wall structure 111, and the multilayer wall is soldered with the soldering area 40 to form the vacuum sealed space 60.

Wherein, the multilayer wall structure 111 may include a structure with two or more layers and the number of the soldering areas 40 may also be adjusted based on the requirements. For example, the multilayer wall structure 111 shown in FIG. 5 has a three-layer structure and the number of the corresponding soldering area 40 is one. However, this is only for example and is not for limitation, i.e., the number of the soldering areas 40 may also be three which correspond to three-layer structure respectively; the number of the soldering areas 40 may also be two in which one of the soldering areas 40 corresponds to a two-layer structure and another soldering area 40 corresponds to the remaining one-layer structure. Therefore, the number of structure layers of the multilayer wall structure 111 and the number of the soldering areas 40 may be adjusted according to the design requirements as long as each layer of the multilayer wall structure 111 can be soldered with the soldering area 40.

The multilayer wall structure 111 may enhance the strength of soldering with the soldering area 40, in order to facilitate the vacuum level in the vacuum sealed space 60 being able to maintain longer time after the package is completed.

Further, the concave structure disclosed by the second embodiment is also applicable to the third embodiment, and the shape of the concave structure 41 thereof may correspond to the shape of the multilayer wall structure 111. Thus, it may further strengthen the multilayer wall structure 111 and may enhance the strength of soldering with the soldering area 40.

Figure 6:
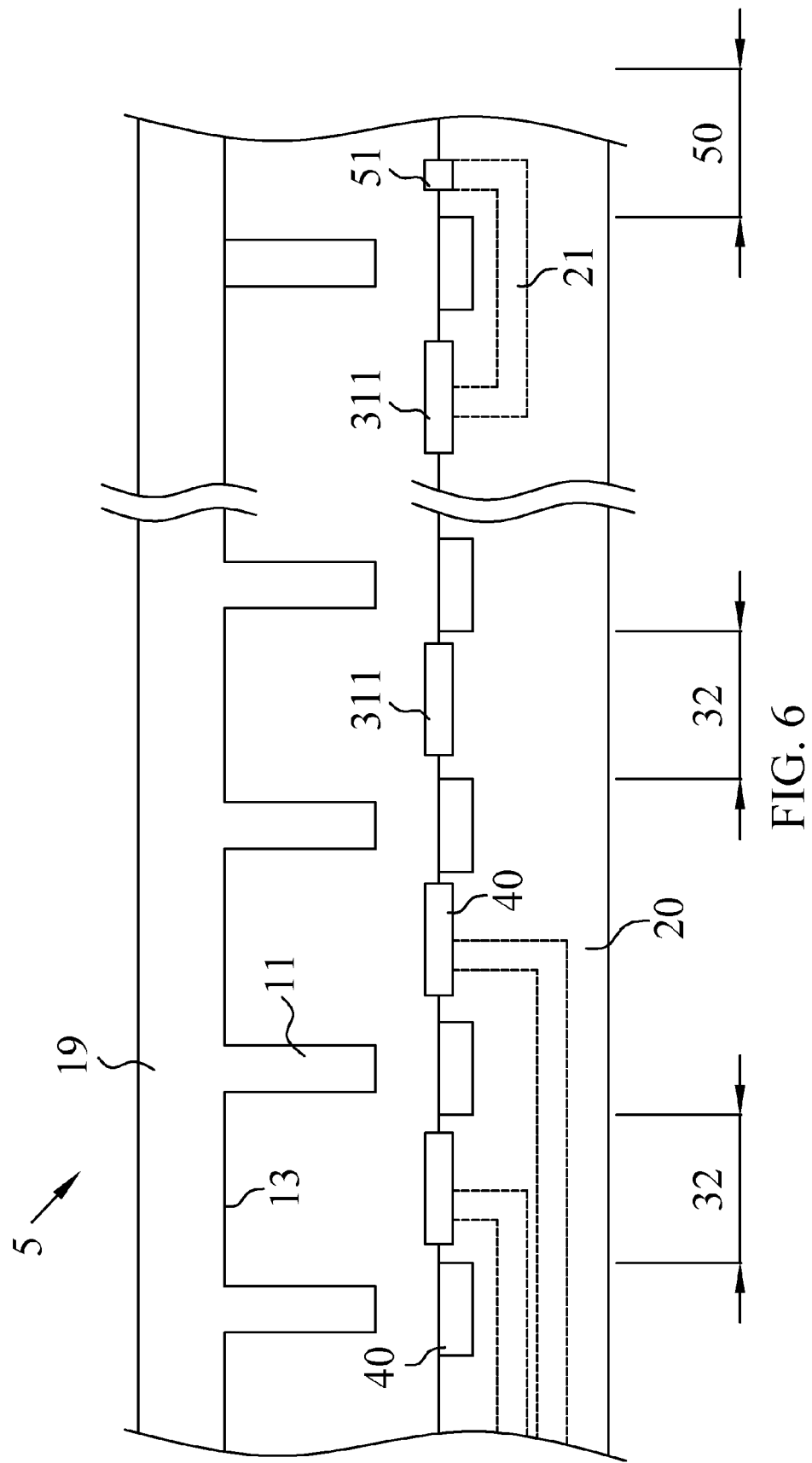
FIG. 6 is a cross-sectional view of a fourth embodiment of a wafer level package structure for temperature sensing elements according to the present invention.
Figure 7:
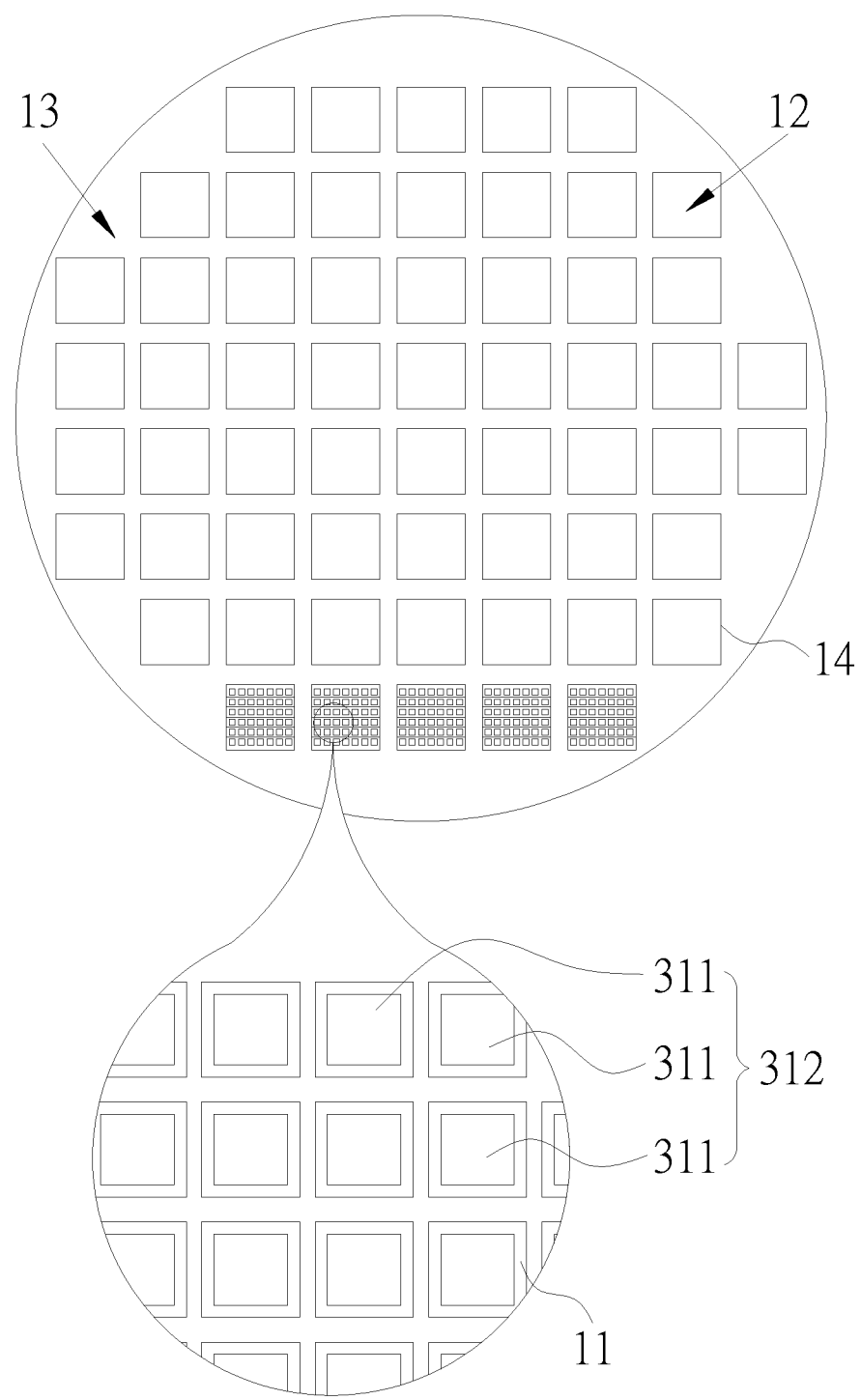
FIG. 7 is a schematic view of a wafer cover of the fourth embodiment of the wafer level package structure for temperature sensing elements according to the present invention.

Please refer to FIG. 6 and FIG. 7, which are a cross-sectional view of the fourth embodiment and a schematic view of the wafer cover of the wafer level package structure for temperature sensing elements according to the present invention. The difference between the fourth embodiment and the embodiments described above is that each pixel 311 of each group pixel 312 of the temperature sensing chip are sealed with the package wall 11, that is, each pixel 311 has a separate vacuum sealed space. Thus, even if the vacuum levels of sealed spaces of a few pixels 311 drop, it will not affect the other pixels 311; even if the pixels 311 with dropped vacuum levels has error in the sensing values of the infrared, the sensing values of its surrounding pixels 311 may still be used to compensate the estimated output electrical value of bad pixel in order to produce the whole thermal images.

Figure 8:
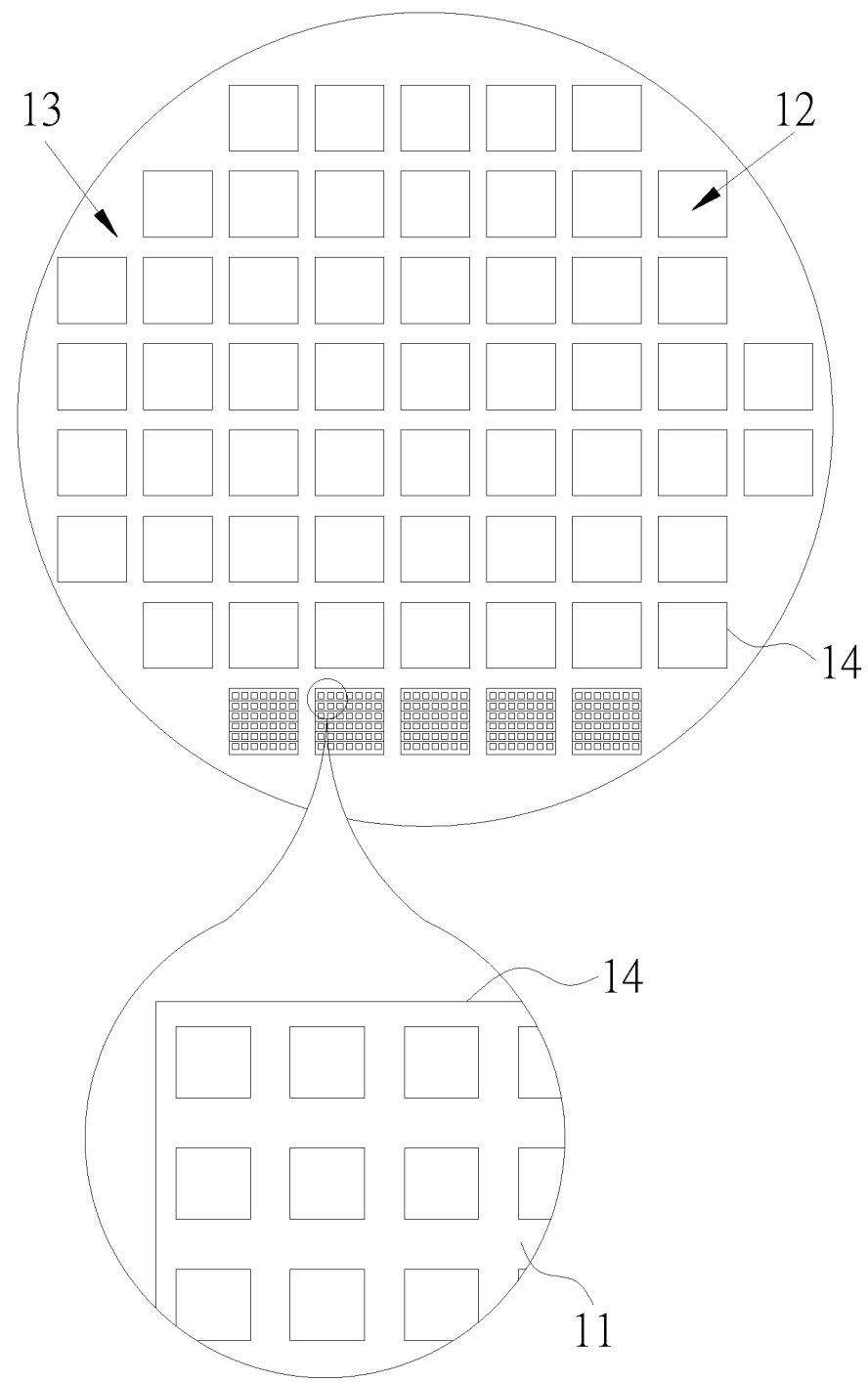
FIG. 8 is a schematic view of a wafer cover of the fifth embodiment of the wafer level package structure for temperature sensing elements according to the present invention.

Please refer to FIG. 8, which is a schematic view of a wafer cover of the fifth embodiment of the wafer level package structure for temperature sensing elements according to the present invention. The difference between the fifth embodiment and the embodiments described above is that each pixel 311 of the temperature sensing chip shares the package wall 11.

Further, the other structures of the package wall 11 in the embodiments described above are also applicable to the fifth embodiment.

Figure 9:
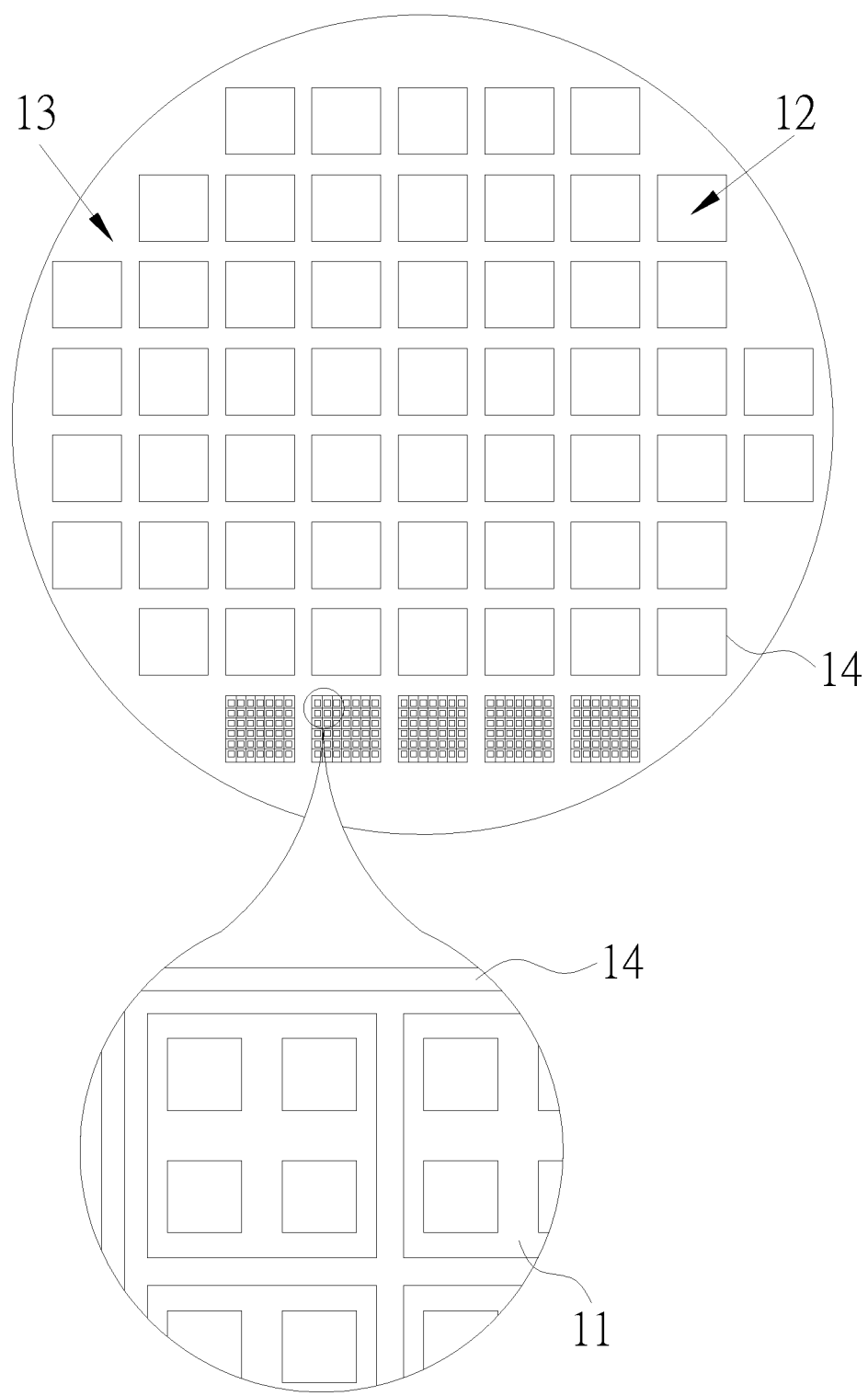
FIG. 9 is a schematic view of a wafer cover of the sixth embodiment of the wafer level package structure for temperature sensing elements according to the present invention.

Please refer to FIG. 9, which is a schematic view of a wafer cover of the sixth embodiment of the wafer level package structure for temperature sensing elements according to the present invention. The difference between the sixth embodiment and the embodiments described above is that each group pixel 312 of the temperature sensing chip are sealed with the package wall 11, i.e. each group pixel 312 has a separate vacuum sealed space. In this way, other normal group pixels 312 will not be affected in the case that the vacuum levels of the sealed spaces of a few group pixels 312 drop. Although the group pixels 312 with dropped vacuum levels has error in the sensing values of the infrared, the sensing values of its surrounding group pixels 312 may still be used to compensate the estimated output electrical value of bad pixel in order to produce the whole thermal images.

The specific embodiments proposed in the detailed descriptions of the preferred embodiments are merely used for the ease of explanation to the technical contents of the present invention, rather than to limit the present invention to the embodiments described above with a narrow sense, various changes made for implementation are within the scope of the present invention in the case of without departing from the spirit and the following claims of the present invention.

What is claimed is:

1. A wafer level package structure for temperature sensing elements, comprising:
    a wafer cover which is formed of an infrared penetrable material, the wafer cover having a plurality of package walls, and the plurality of package walls forming a plurality of first grooves and a plurality of second grooves in the wafer cover; and
    a substrate comprising a plurality of chip areas, a plurality of soldering areas, and a plurality of pin areas, a plurality of temperature sensing chips being respectively disposed in the plurality of chip areas corresponding to the plurality of first grooves, each of the plurality of package walls being soldered with a corresponding one of the plurality of soldering areas, the substrate and the plurality of first grooves forming a plurality of vacuum sealed spaces respectively in the plurality of chip areas, and the plurality of pin areas being cut to form a plurality of packaging devices of temperature sensing elements and corresponding to the plurality of second grooves.

2. The wafer level package structure for temperature sensing elements of claim 1, wherein the infrared penetrable material comprises germanium, silicon, chalcogenide or sulfide.

3. The wafer level package structure for temperature sensing elements of claim 1, wherein the plurality of package walls include a plurality of package rings, and an area defined by each of the plurality of package rings corresponding to each of the plurality of chip areas, and a ring wall of each of the plurality of package rings corresponding to each of the plurality of soldering areas.

4. The wafer level package structure for temperature sensing elements of claim 1, wherein each of the plurality of soldering areas comprises a testing circuit.

5. The wafer level package structure for temperature sensing elements of claim 1, wherein each of the plurality of soldering areas includes a concave structure, and the concave structure of the each of the plurality of soldering areas is engaged by a corresponding one of the plurality of package walls.

6. The wafer level package structure for temperature sensing elements of claim 1, wherein each of the plurality of pin areas electrically connects to the temperature sensing chip respectively through a metal layer with isolation film structure at a lower side of the soldering area.

7. The wafer level package structure for temperature sensing elements of claim 1, wherein each of the plurality of package walls is a multi-layer wall structure.

8. The wafer level package structure for temperature sensing elements of claim 7, wherein each of the plurality of soldering areas includes a concave structure, and the concave structure of each of the plurality of soldering areas is engaged by the corresponding multi-layer wall structure of the plurality of package walls.

9. A wafer level package structure for temperature sensing elements, comprising:
    a wafer cover which is formed of an infrared penetrable material, the wafer cover having a plurality of package walls, and the plurality of package walls forming a plurality of first grooves and a plurality of second grooves in the wafer cover; and
    a substrate comprising a plurality of pixel areas, a plurality of soldering areas, and a plurality of pin areas, the plurality of pixel areas being disposed with a plurality of pixels of at least one temperature sensing chip respectively and corresponding to the plurality of first grooves respectively, each of the plurality of soldering areas being soldered with a corresponding one of the plurality of package walls, the substrate and the plurality of first grooves forming a plurality of vacuum sealed spaces respectively in the plurality of pixel areas, and the plurality of pin areas being cut to form a plurality of packaging devices of temperature sensing elements and corresponding to the plurality of second grooves.

10. The wafer level package structure for temperature sensing elements of claim 9, wherein the infrared penetrable material comprises germanium, silicon, chalcogenide or sulfide.

* * * * *